(12) United States Patent
Chuang et al.

(10) Patent No.: US 8,169,814 B2
(45) Date of Patent: May 1, 2012

(54) SCHMITT TRIGGER-BASED FINFET SRAM CELL

(75) Inventors: Ching-Te Chuang, Taipei County (TW); Chien-Yu Hsieh, Taichung (TW); Ming-Long Fan, Taichung (TW); Pi-Ho Hu, Hsinchu (TW); Pin Su, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 1 day.

(21) Appl. No.: 12/876,582

(22) Filed: Sep. 7, 2010

(65) Prior Publication Data

US 2012/0014171 A1    Jan. 19, 2012

(30) Foreign Application Priority Data

Jul. 16, 2010 (TW) ................. 99123534 A

(51) Int. Cl.
*G11C 11/00* (2006.01)
(52) U.S. Cl. ........................ 365/154; 365/156
(58) Field of Classification Search .................. 365/156, 365/154
See application file for complete search history.

(56) References Cited

U.S. PATENT DOCUMENTS
7,400,525 B1   7/2008 Kim

2007/0183185 A1   8/2007 Guo et al.
2009/0086528 A1*  4/2009 Hanafi .................. 365/156

OTHER PUBLICATIONS

Kulkarni, et al., "A 160 mV Robust Schmitt Trigger Based Subthreshold SRAM", IEEE Journal of Solid-State Circuits, Vo. 42, No. 10, Oct. 2007, pp. 2303-2313.
Kulkarni, et al., "Process Variation Tolerant SRAM Array for Ultra Low Voltage Applications", National Chiao Tung University, downloaded on Feb. 13, 2009 from IEEE Xplore., pp. 108-113.
Vita, et al., "Static Noise Margin of Ultrathin-Body SOI Subthreshold SRAM Cells—An Assessment Based on Analytical Solutions of Poisson's Equation", IEEE Transactions on Electron Devices, vol. 56, No. 9, Sep. 2009, pp. 2120-2127.
Fan, et al., "Investigation of Static Noise Margin of FinFET SRAM Cells in Sub-threshold Region", Proc. Of SOI Conference, 2009.

* cited by examiner

*Primary Examiner* — Huan Hoang
(74) *Attorney, Agent, or Firm* — Muncy, Geissler, Olds & Lowe, PLLC

(57) ABSTRACT

The present invention provides a Schmitt trigger-based FinFET static random access memory (SRAM) cell, which is an 8-FinFET structure. A FinFET has the functions of two independent gates. The new SRAM cell uses only 8 FinFET per cell, compared with the 10-FinFET structure in previous works. As a result, the cell structure of the present invention can save chip area and raise chip density. Furthermore, this new SRAM cell can effectively solve the conventional problem that the 6T SRAM cell is likely to have read errors at a low operating voltage.

8 Claims, 9 Drawing Sheets

SCHMITT TRIGGER-BASED FINFET SRAM CELL

BACKGROUND OF THE INVENTION

1. Field of the Invention

The present invention relates to a SRAM cell, particularly to a Schmitt trigger-based FinFET SRAM cell.

2. Description of the Related Art

Embedded memories are used in various hardwares to store data, such as communication products, consumer electronic products, microprocessors. Electronic products are getting smaller and smaller, and the semiconductor industry is persistently devoted to reducing the size of semiconductor elements (such as MOSFET) so as to increase the speed, performance and density of IC and decrease the unit cost of IC. However, variance and uncertainty of MOSFET properties rises with reduction of MOSFET size. The current SRAM design has been evolved to pursue low voltage and high speed. In the design of a low-voltage memory, the achievable minimum operating voltage of 6T SRAM is limited by write failure and read interference. Facing the development of nanometric components, some researchers begin to design new structures for components. For example, the traditional planar gate is transformed to three-dimensionalized to have a fin-like structure, i.e. the so-called FinFET. The three-dimensional gate structure of FinFET can more effectively control the channel and inhibit leakage current caused by the punch-through effect. Therefore, FinFET has higher controllability over the gate than the traditional FET. Further, FinFET can greatly reduce the size of semiconductor chips and the power consumed by each logical gate.

Refer to FIG. 1 a diagram schematically showing a 6T SRAM cell. A 6T SRAM comprises a memory cell 10 containing a pair of cross coupled inverters 12 and 14, a first pass transistor 28, and a second pass transistor 30. The storage node 16 of the first inverter 12 is connected with the gates of a p-type transistor 18 and an n-type transistor 20 of the inverter 14. The storage node 22 of the inverter 14 is connected with the gates of a p-type transistor 24 and an n-type transistor 26 of the inverter 12. The n-type transistor 26 of the inverter 12 is grounded. The p-type transistor 24 of the inverter 12 is connected with a supply voltage $V_{cs}$. The n-type transistor 20 of the inverter 14 is grounded. The p-type transistor 18 of the inverter 14 is connected with the supply voltage $V_{cs}$. The first pass transistor 28 is connected with a bit line BL and controls the output of the storage node 16 of the inverter 12. The second pass transistor 30 is connected with a complementary bit line BR and controls the output of the storage node 22 of the inverter 14. The first pass transistor 28 and the second pass transistor 30 are controlled by a common write line WL. In a read activity, the bit lines BL and BR are charged to "1"—a high potential. Suppose that the storage node 16 of the inverter 12 stores data "0" and that the storage node 22 of the inverter 14 stores data "1". In the start of a read activity, the write line turns on the first pass transistor 28 and the second pass transistor 30. The storage node 16 storing data "0" is successfully discharged by the bit line BL via the path of the n-type transistor 26 of the inverter 12. When the first pass transistor 28 and the second pass transistor 30 are both turned on, the first pass transistor 28 and the n-type transistor 26 of the inverter 12 forms a bleeder circuit. The storage node 16 originally storing data "0" has a read disturb. In a low operating voltage environment, the voltage of the storage node 16 plus the noise of the inverter 12 and first pass transistor 28 is likely to exceed the trip voltage of the inverter 14 and reword the data stored in the inverter 14. Thus is caused a read error.

Refer to FIG. 2 for a design to overcome the noise-and-low operating voltage-induced read error of a 6T SRAM cell. In FIG. 2, four transistors are added to the original 6T SRAM cell to form a 10T SRAM cell. The transistors in FIG. 1 and FIG. 2 are all FinFETs. In FIG. 2, the first pass transistor 28 is connected with the gate of a third pass transistor 32, and the drain of the third pass transistor 32 is connected with the supply voltage $V_{cs}$. The n-type transistor of the inverter 12 is further connected with an n-type transistor 34. The n-type transistor 34 is grounded, and the source of the third pass transistor 32 is connected with the drains of the n-type transistors 26 and 34. The second pass transistor 30 is connected with a fourth pass transistor 36, and the drain of the fourth pass transistor 36 is connected with the supply voltage $V_{cs}$. The n-type transistor 20 of the inverter 14 is further connected with an n-type transistor 38. The n-type transistor 38 is grounded, and the source of the fourth pass transistor 36 is connected with the drains of the n-type transistors 20 and 38. In the start of a read activity, the write line WL turns on the first and second pass transistors 28 and 30. The conduction state of the third pass transistor 32/fourth pass transistor 36 is determined according to whether "0" or "1" is stored in the storage node. The storage node 16 storing "0" is successfully discharged by the bit line BL via the path of the n-type transistors 26 and 34 of the inverter 12. The storage node 22 of the inverter 14 is at the supply voltage. The node between the drains of the n-type transistors 20 and 38 has a voltage of the supply voltage $V_{cs}$ minus the threshold voltage $V_t$ of the fourth pass transistor 36. Thus is effectively increased the drain voltage of the n-type transistor 38 and the trip voltage of the inverter 14. In a low operating voltage environment, the read disturb of the storage node 16 plus the noise is still far below the trip voltage of the inverter 14. Thus is increased RSNM (Read Static Noise Margin) and avoided read errors. Refer to FIG. 3. The gates of the third pass transistor 32 and the fourth pass transistor 36 are connected with the word line WL and turned on in a read and write activity. The drains of the third pass transistor 32 and fourth pass transistor 36 are respectively connected with the bit line BL and the complementary bit line BR. Thereby, a write word line WWL turns on the first pass transistor 28 and the second pass transistor 30 in a write activity; the word line WL regulates the turn-on timing of the third pass transistor 32 and fourth pass transistor 36. The SRAM cell in FIG. 3 outperforms the SRAM cell in FIG. 2 in that the smaller voltage-division effect would not cause errors in a read activity. However, a SRAM cell containing ten transistors occupies too great an area and is hard to promote the chip density. Further, a SRAM cell having a greater area would have higher power consumption and lower performance.

Accordingly, the present invention proposes a Schmitt trigger-based FinFET SRAM cell to overcome the abovementioned problems.

SUMMARY OF THE INVENTION

The primary objective of the present invention is to provide a Schmitt trigger-based FinFET SRAM cell, wherein the 10T SRAM cell is reduced into an 8T FinFET SRAM cell, whereby the number of transistors and chip area are effectively decreased.

Another objective of the present invention is to provide a Schmitt trigger-based FinFET SRAM cell, whereby are increased the reliability of the memory cell and the immunity to the parametric variation of the fabrication process.

A further objective of the present invention is to provide a Schmitt trigger-based FinFET SRAM cell, wherein the FinFET has the functions of two independent gates, whereby is effectively simplified the circuit layout of SRAM and reduced the area of SRAM, wherefore is fabricated a high-density SRAM memory.

To achieve the abovementioned objectives, the present invention proposes a Schmitt trigger-based FinFET SRAM cell, which comprises a first control FinFET having a first gate and a second gate; a second control FinFET having a third gate and a fourth gate; a first bit line connected with the drain of the first control FinFET and supplying a first voltage signal; a second bit line connected with the drain of the second control FinFET and supplying a second voltage signal; a first read/write control line connected with the first gate and the third gate and simultaneously controlling the conduction states of the first control FinFET and the second control FinFET; a second read/write control line connected with the second gate and the fourth gate and simultaneously controlling the conduction states of the first control FinFET and the second control FinFET; and a SRAM cell connected with the sources of the first control FinFET and the second control FinFET and performing a read, write or keep activity according to the conduction state of the first control FinFET, the conduction state of the second control FinFET, the first voltage signal and the second voltage signal.

Below, the embodiments are described in detail to make easily understood the objectives, technical contents, characteristics and accomplishments of the present invention.

DETAILED DESCRIPTION OF THE INVENTION

The present invention is to solve the conventional problem that read errors are likely to occur in the 6T SRAM in a low operating voltage environment. The present invention improves the 10T SRAM into an 8T FinFET SRAM without compromising the performance.

Figure 4:
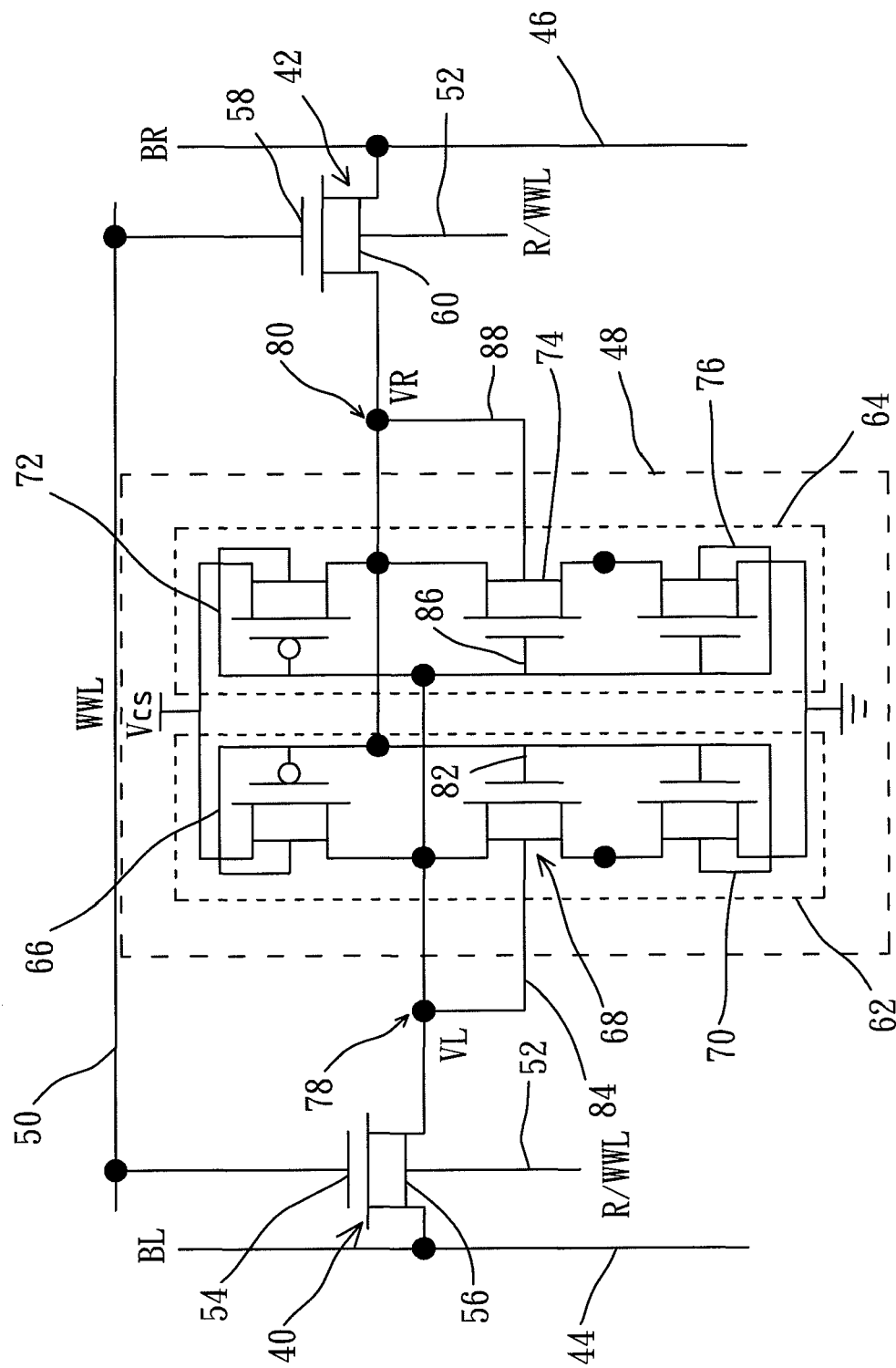
FIG. 4 is a diagram schematically showing a Schmitt trigger-based FinFET SRAM cell according to a first embodiment of the present invention.

Refer to FIG. 4 for a Schmitt trigger-based FinFET SRAM cell according to a first embodiment of the present invention. The Schmitt trigger-based FinFET SRAM cell of the present invention comprises a first control FinFET 40, a second control FinFET 42, a first bit line 44 (BL), a second bit line 46 (BR), a memory cell 48, a first read/write control line 50 (WWL), and a second read/write control line 52 (R/WWL). The first bit line 44 is connected with the drain of the first control FinFET 40 and supplies a first voltage signal. The second bit line is connected with the drain of the second control FinFET 42 and supplies a second voltage signal. The first control FinFET 40 has a first gate 54 and a second gate 56. The second FinFET 42 has a third gate 58 and a fourth gate 60. The first read/write control line 50 is connected with the first gate 54 and the third gate 58 and simultaneously controls the conduction states of the first control FinFET 40 and the second control FinFET 42. The second read/write control line 52 is connected with the second gate 56 and the fourth gate 60 and simultaneously controls the conduction states of the first control FinFET 40 and the second control FinFET 42. The memory cell 48 includes a first inverter 62 and a second inverter 64 cross coupled to each other. The first inverter 62 includes a first FinFET 66, a second FinFET 68 and a third FinFET 70, which are connected with each other. The second inverter 64 includes a fourth FinFET 72, a fifth FinFET 74 and a sixth FinFET 76, which are connected with each other. The first inverter 62 has a first storage node 78 connected with the gates of the fourth, fifth and sixth FinFETs 72, 74 and 76 and the source of the first control FinFET 40. The second inverter 64 has a second storage node 80 connected with the gates of the first, second and third FinFETs 66, 68 and 70 and the source of the second control FinFET 42. The third FinFET 70 and the sixth FinFET 76 are grounded. The first FinFET 66 and the fourth FinFET 72 are connected to a power source $V_{cs}$. The memory cell 48 performs a read, write or keep activity according to the conduction state of the first control FinFET 40, the conduction state of the second control FinFET 42, the first voltage signal of the first bit line 44, and the second voltage signal of the second bit line 46. The second FinFET 68 has a fifth gate 82 and a sixth gate 84. The fifth FinFET 74 has a seventh gate 86 and an eighth gate 88. Each of from the fifth gate 82 to the eighth gate 88 is independently used to perform controls. Below is described a first connection mode of the second FinFET 68 and the fifth FinFET 74 which can upgrade the reliability of read activities of the entire SRAM. The fifth gate 82 of the second FinFET 68 is connected with the gates of the first FinFET 66 and the third FinFET 70. The sixth gate 84 of the second FinFET 68 is connected with the source of the first control FinFET 40. The seventh gate 86 of the fifth FinFET 74 is connected with the gates of the fourth FinFET 72 and the sixth FinFET 76. The eighth gate 88 of the fifth FinFET 74 is connected with the source of the second control FinFET 42. Suppose that the first storage node 78 of the first inverter 62 stores "0" and that second storage node 80 of the second inverter 64 stores "1". In a read activity, the first voltage signal of the first bit line 44 and the second voltage signal of the second bit line 46 are precharged to a high level. Next, the second read/write control line 52 turns on the first control FinFET 40 and the second FinFET 42. At this time, the first FinFET 66 is turned off; the first control FinFET 40, the second FinFET 68 and the third FinFET 70 are turned on to form a bleeder circuit for discharging. Thus, the first bit line 44 is successfully discharged in the case that first storage node 78 stores "0". The voltage of the second storage node 80 is at a high level. The seventh gate 86 and the eighth gate 88 of the fifth FinFET 74 are two independent control gates. In the fifth FinFET 74, the seventh gate 86 is turned off, and the eighth gate 88 is turned on. Therefore, the fifth FinFET 74 is in a partial-conduction state. At this time, the drain voltage of the sixth FinFET 76 is equal to $(V_{cs}-V_t)$—the terminal voltage $(V_{cs})$ of the second storage node 80 minus the threshold voltage $(V_t)$ of the fifth FinFET 74. Thereby is effectively increased the trip voltage of the second inverter 64. In a low-voltage operating environment, when the first storage node 78 is performing a read activity, the divided voltage plus the noise is still far below the trip voltage of the second inverter 64 in the present invention. In a read activity, only the second read/write control line 52 that controls the first control FinFET 40 and the second control FinFET 42 is turned on. Thus is decreased the divided voltage in a read activity. Therefore, the present invention not only increases RSNM but also prevents from read errors.

Figure 5:
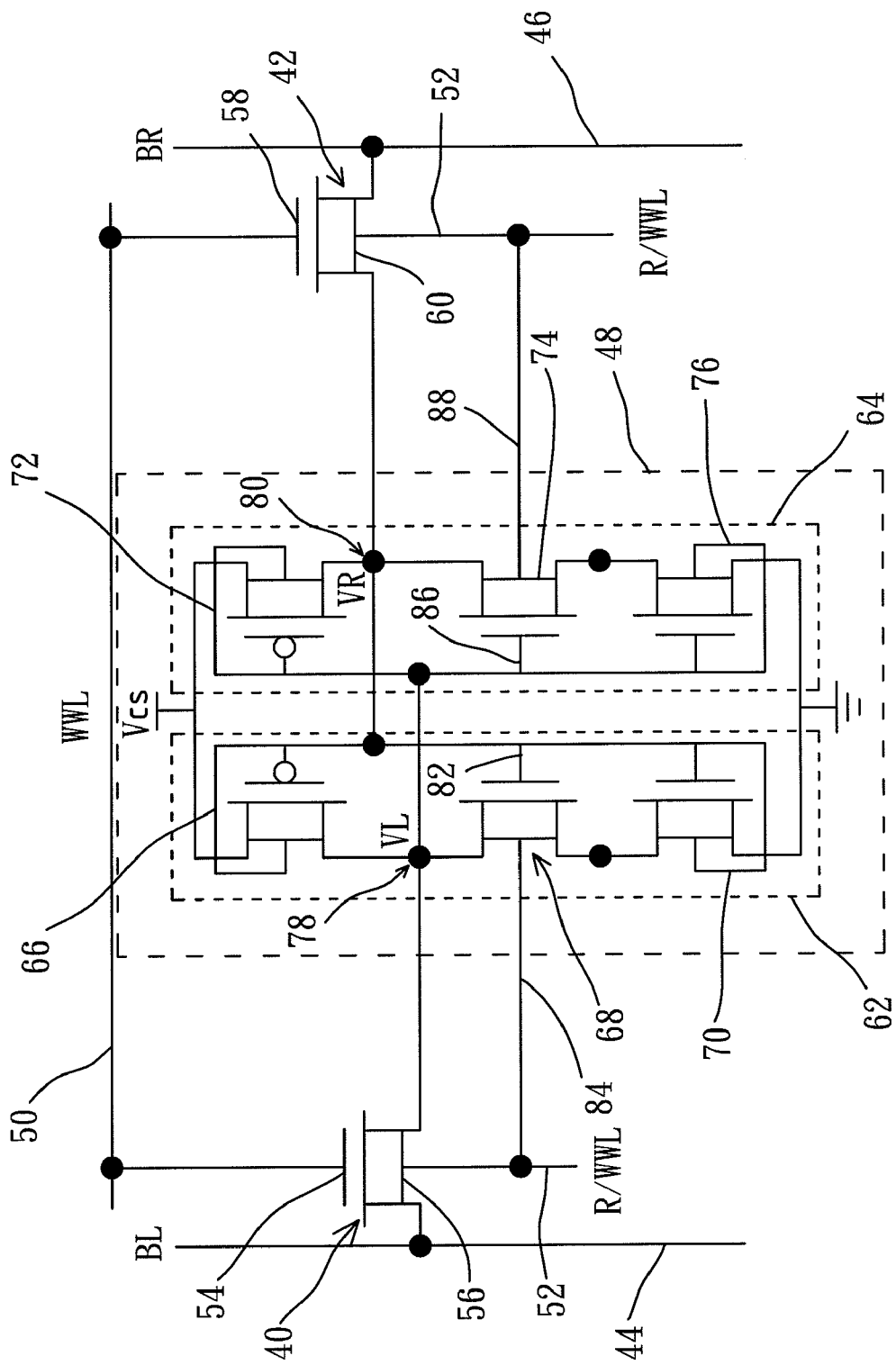
FIG. 5 is a diagram schematically showing a Schmitt trigger-based FinFET SRAM cell according to a second embodiment of the present invention.

Refer to FIG. 5 for a Schmitt trigger-based FinFET SRAM cell according to a second embodiment of the present invention. The second embodiment is different from the first embodiment in that the sixth gate 84 of the second FinFET 68 and the eighth gate 88 of the fifth FinFET 74 are respectively connected with the second read/write control line 52. The read activity of the second embodiment is basically similar to that of the first embodiment. The difference therebetween is described below. When the first voltage signal of the first bit line 44 and the second voltage of the bit line 46 are precharged to a high level, the conduction states of the first read/write control line 50 and the second read/write control line 52 are controlled to regulate the time for reading data. The first read/write control line 50 is connected with the first gate 54 of the first control FinFET 40 and the third gate 58 of the second control FinFET 42. The second read/write control line 52 is connected with the second gate 56 of the first control FinFET 40 and the fourth gate 60 of the second control FinFET 42. Suppose that the second read/write control line 52 controls the second gate 56 of the first control FinFET 40 and the fourth gate 60 of the second control FinFET 42 to have a conduction state. At this time, the first gate 54 and the third gate 58 are turned off; the first FinFET 66 is turned off; the first control FinFET 40, the second FinFET 68 and the third FinFET 70 are turned on to form a bleeder circuit for discharging. Thus, the first bit line 44 is successfully discharged in the case that the first storage node 78 stores "0". The fifth gate 82 and the sixth gate 84 of the second FinFET 68 are two independent control gates. At this time, the fifth gate 82 and the sixth gate 84 are turned on. When the second read/write control line 52 controls the second gate 56 of the first control FinFET 40 and the fourth gate 60 of the second control FinFET 42 to have a conduction state, the first gate 54 of the first control FinFET 40 and the third gate 58 of the second control FinFET 42 are turned off. Thus is decreased the divided voltage in a read activity. The second read/write control line 52 controls the fifth FinFET 74 to have a partial-conduction state. At this time, the drain voltage of the sixth FinFET 76 is equal to $(V_{cs}-V_t)$—the terminal voltage $(V_{cs})$ of the second storage node 80 minus the threshold voltage $(V_t)$ of the fifth FinFET 74. Thereby is effectively increased the trip voltage of the second inverter 64 and avoided read errors.

Figure 6:
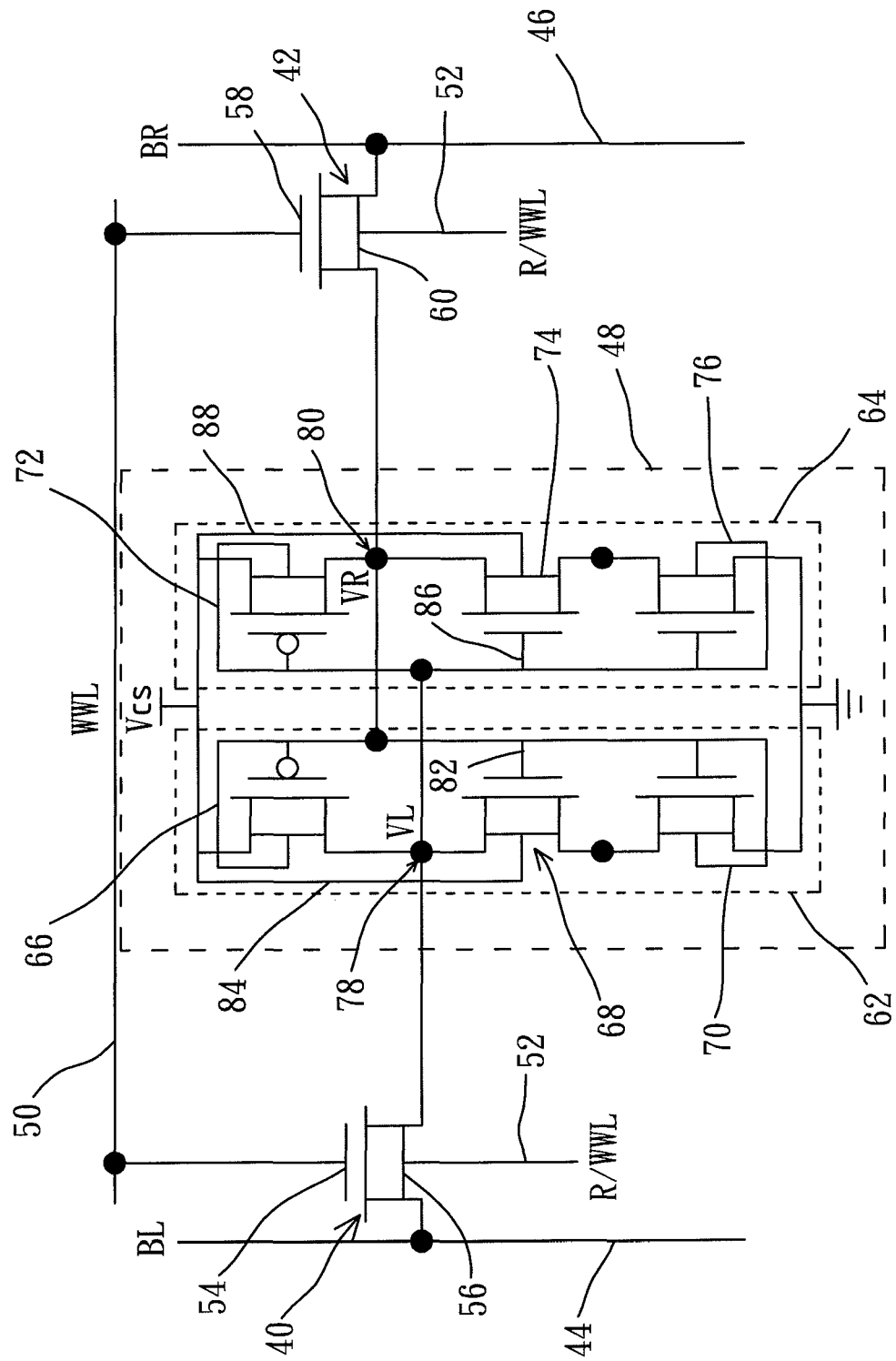
FIG. 6 is a diagram schematically showing a Schmitt trigger-based FinFET SRAM cell according to a third embodiment of the present invention.

Refer to FIG. 6 for a Schmitt trigger-based FinFET SRAM cell according to a third embodiment of the present invention. The third embodiment is different from the first embodiment in that the sixth gate 84 of the second FinFET 68 and the eighth gate 88 of the fifth FinFET 74 are connected with the power source $(V_{cs})$. Therefore, the sixth gate 84 and the eighth gate 88 are maintained at a conduction state. The conduction sates of the fifth gate 82 and the seventh gate 86 are controlled by the first storage node 78 and the second storage node 80. The principle that data can be successfully read in the first embodiment also applies to the third embodiment.

In the abovementioned embodiments, read activities are used to demonstrate the principle of the present invention. The memory cell 48 performs a write activity when the first bit line 44 and the second bit line 46 have anti-phase voltage signals and when the first read/write control line 50 and the second read/write control line 52 turns on the first control FinFET 40 and the second control FinFET 42. When the first read/write control line 50 and the second read/write control line 52 are simultaneously turned off, the memory cell 48 performs a data-keep activity.

Figure 7:
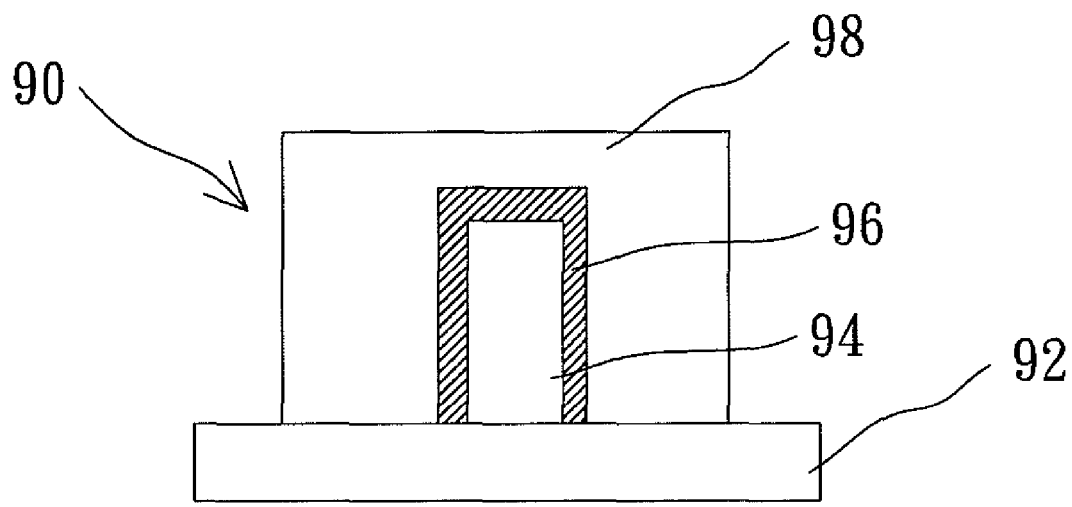
FIG. 7 is a diagram schematically showing a conventional FinFET structure.
Figure 8:
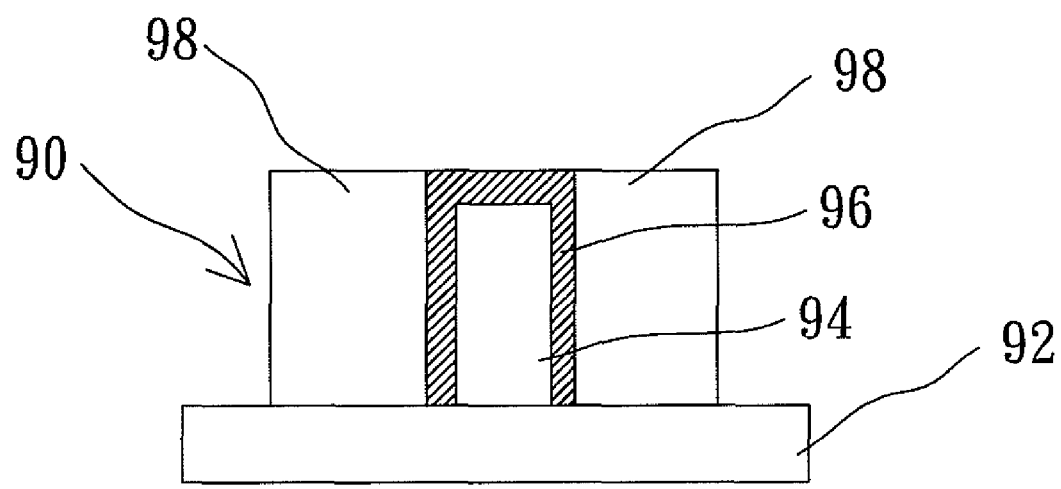
FIG. 8 is a diagram schematically showing a FinFET structure according to one embodiment of the present invention.

The present invention reduces the 10T SRAM cell into an 8T FinFET SRAM cell without reducing the performance. Below are compared the FinFET structures of both. Refer to FIG. 7 and FIG. 8 diagrams respectively showing the FinFET structures of the conventional technology and the present invention. In FIG. 7, a FinFET 90 stands on a substrate 92 and includes a first source/drain region, a second source/drain region, and a fin-like structure 94 extending between the first source/drain region and the second source/drain region. The fin-like structure 94 is the main structure of the transistor. A gate-insulating layer 96, such as a silicon oxide layer or a high-K oxide layer, is formed on the fin-like structure 94. An inverse-U shaped gate 98 is overlaid on the fin-like structure 94 to form a dual-gate structure having a front gate and a rear gate interconnecting with the front gate. A channel is formed between the first source/drain region and the second source/drain region and extends below the gate 98. Such a structure can reduce the path of current leakage and attain higher driving current, better subthreshold swing and a shorter channel effect. As shown in FIG. 8, the present invention is different from the conventional technology in that the interconnection region between the front gate and the rear gate is cut off to obtain an improved FinFET structure. Thereby, the front gate and the rear gate can be independently used. In from the first embodiment to the third embodiment of the present invention, the second FinFET, the fifth FinFET, the first control FinFET and the second control FinFET are the improved FinFETs. The independent operation of the gates of the second FinFET and the fifth FinFET not only can reduce a 10T SRAM cell into an 8T SRAM cell but also can solve the problem of read errors that the 10T SRAM cell intends to overcome. Further, the present invention can simplify the circuit layout of SRAM and effectively reduce the area of SRAM. Thereby, the present invention can fabricate a high-density SRAM, upgrade the reliability of the memory cell and increase the immunity to the parametric variation of the fabrication process.

Figure 1:
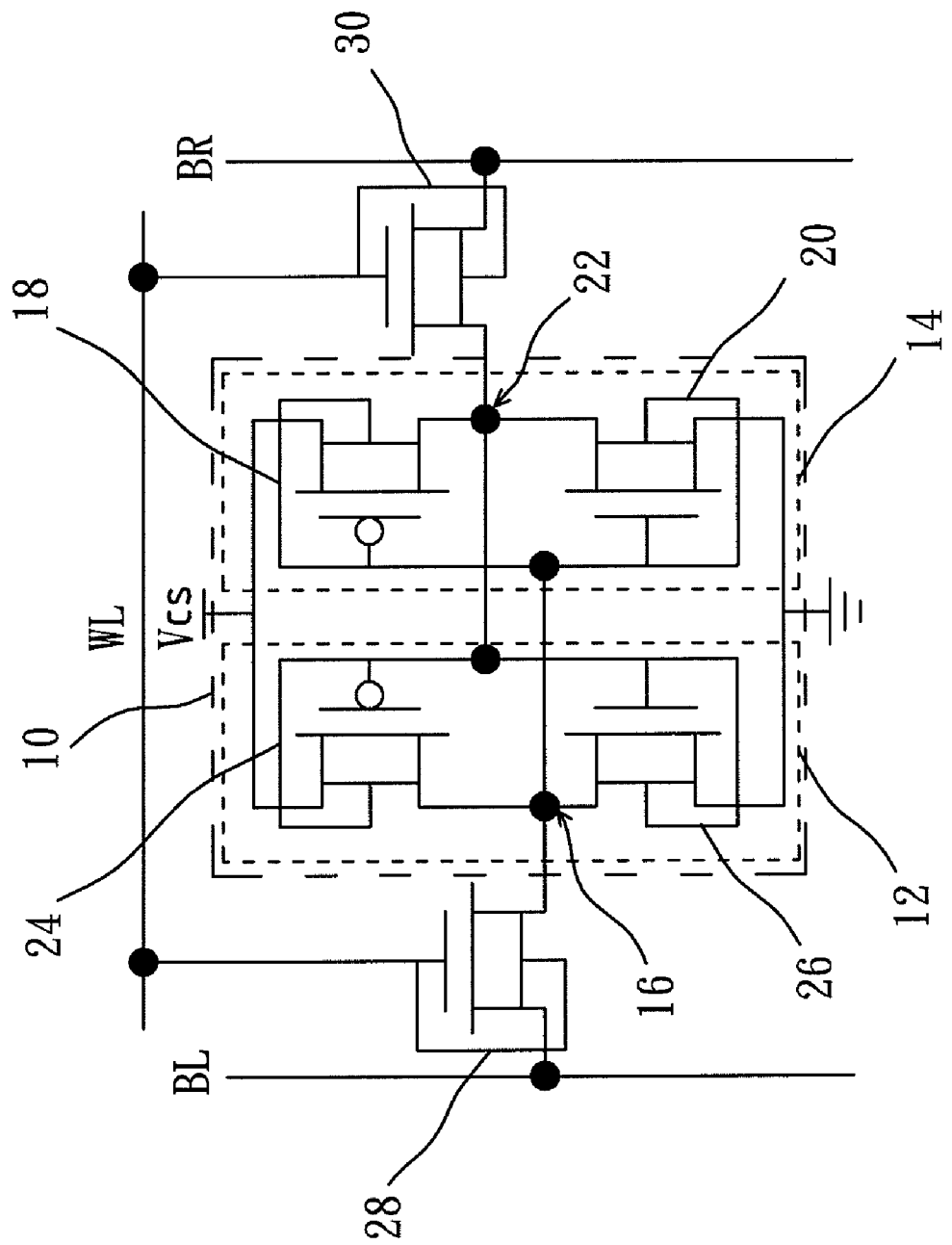
FIG. 1 is a diagram schematically showing a conventional 6T SRAM cell.

Below are compared three SRAM structures of the present invention with three SRAM structures of the conventional technology. The three SRAM structures of the conventional technology are shown in from FIG. 1 to FIG. 3, including a 6T SRAM cell (having six transistors), an ST1 SRAM cell (a first type of 10T SCRM cell) and an ST2 SRAM cell (a second type of 10T SRAM cell). The three SRAM structures of the present invention are shown in from FIG. 4 to FIG. 6, including a IG_ST1 SRAM cell (the first embodiment of 8T SCRAM cell), a IG_ST2 SRAM cell (the second embodiment of 8T SCRAM cell) and a IG_ST3 SRAM cell (the third embodiment of 8T SCRAM cell).

Figure 9:
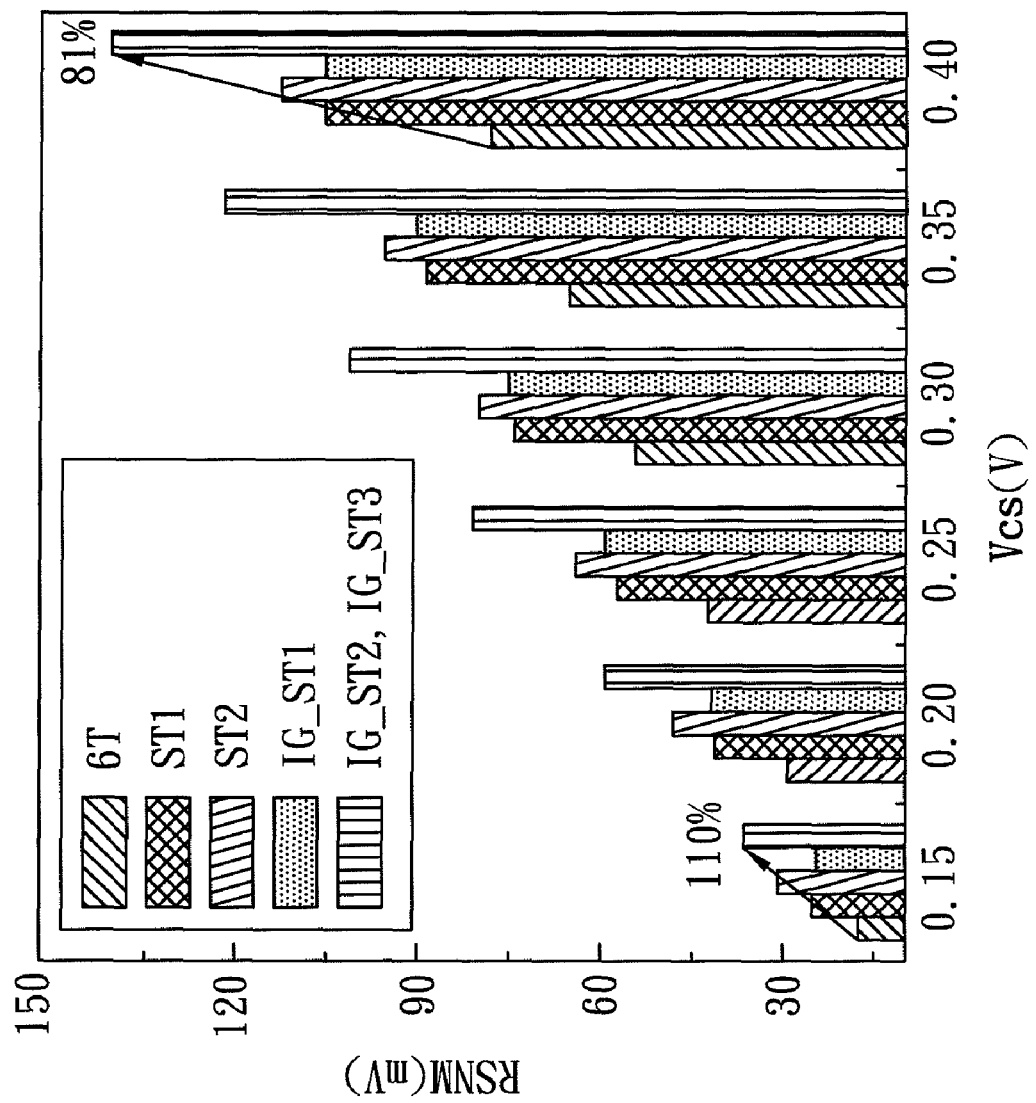
FIG. 9 is a diagram showing the comparison of the allowed RSNMs when the SRAM cells operate at subthreshold voltages.

Refer to FIG. 9 a diagram showing the comparison of the allowed RSNMs when the SRAM cells operate at a subthreshold voltage $V_{cs}$ of 0.15-0.4V. At the subthreshold voltage $V_{cs}$ of 0.4V, the IG_ST2 SRAM cell and the IG_ST3 SRAM cell of the present invention have an allowed RSNM of 150 mV in comparison with the 70 mV allowed RSNM of the conventional 6T SRAM cell, wherein the present invention can increase the read stability by 81% with respect to the conventional 6T SRAM cell. At the subthreshold voltage $V_{cs}$ of 0.15V, the IG_ST2 SRAM cell and the IG_ST3 SRAM cell of the present invention have an allowed RSNM of 40 mV in comparison with the 10 mV allowed RSNM of the conventional 6T SRAM cell, wherein the present invention can increase the read stability by 110% with respect to the conventional 6T SRAM cell. Besides, the architectures of the IG_ST2 SRAM cell and the IG_ST3 SRAM cell are much better that those of other SRAM cells.

Figure 2:
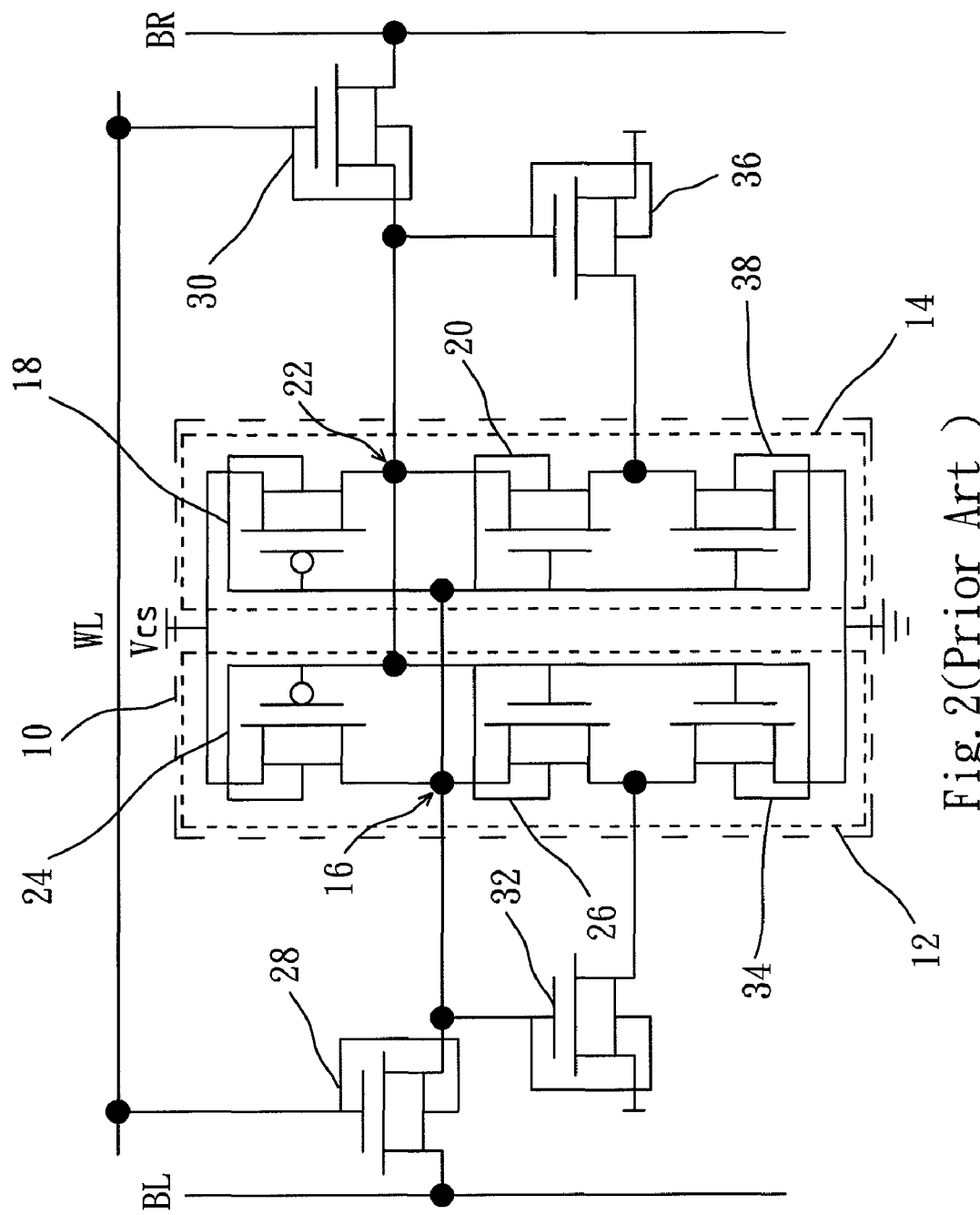
FIG. 2 is a diagram schematically showing a conventional 10T SRAM cell.
Figure 3:
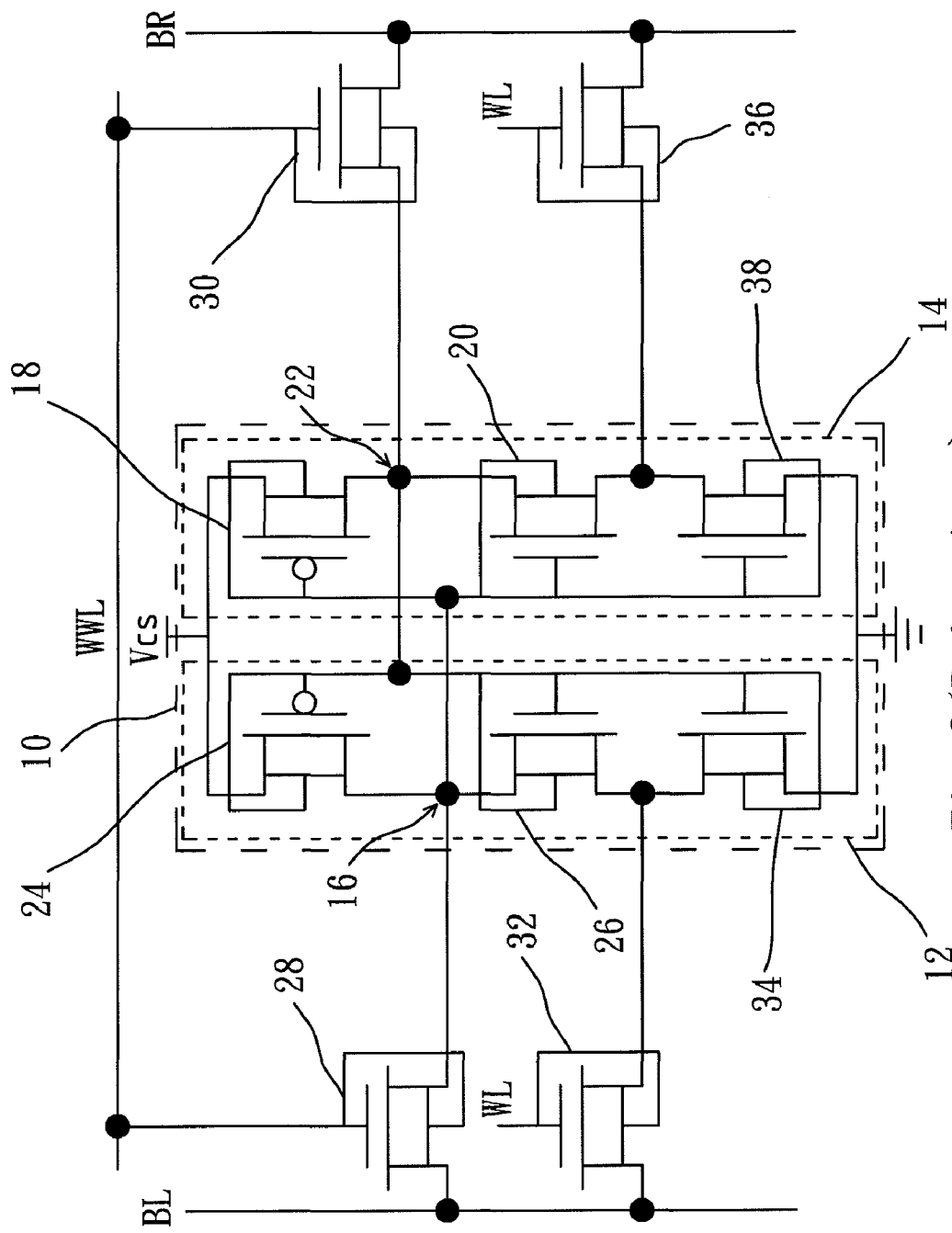
FIG. 3 is a diagram schematically showing another conventional 10T SRAM cell.
Figure 10:
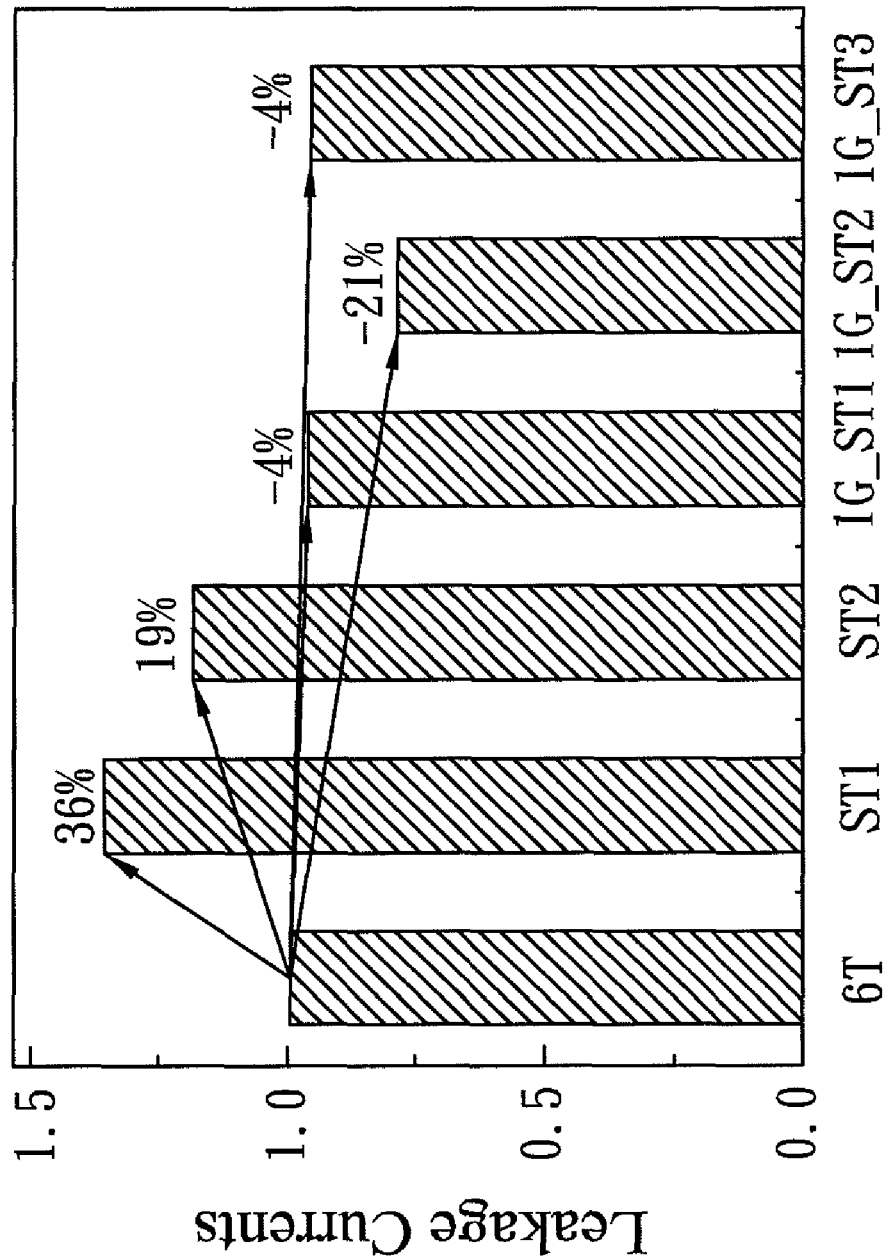
FIG. 10 is a diagram showing the comparison of the leakage currents when the SRAM cells are in a data-keep state.

Refer to FIG. 10 a diagram showing the comparison of the leakage currents when the SRAM cells are in a data-keep state. Refer to FIG. 2 and FIG. 3 again. As the ST1 SRAM cell and the ST2 SRAM cell have more transistors, there are more current-leakage paths passing the n-type transistor 34 of the inverter 12 and the n-type transistor 38 of the inverter 14. Therefore, the leakage currents of the ST1 SRAM cell and the ST2 SRAM cell are respectively higher than that of the 6T SRAM cell by 36% and 19%. Refer to FIG. 4 and FIG. 6 again. As the second FinFET 68 and the fifth FinFET 74 in the IG_ST1 SRAM cell and the IG_ST3 SRAM cell are connected in series, the leakage currents thereof are lower than that of the 6T SRAM cell by 4%. Refer to FIG. 5 again. As the sixth gate 84 of the second FinFET 68 and the eighth gate 88 of the fifth FinFET 74 in the IG_ST2 SRAM cell are always turned off, the leakage current thereof is lower than that of the 6T SRAM cell by 21%. Therefore, the present invention can effectively reduce the power consumption of SRAM.

The embodiments described above are only to exemplify the present invention but not to limit the scope of the present invention. Any equivalent modification or variation according to the characteristics and spirit of the present invention is to be also included within the scope of the present invention.

What is claimed is:

1. A Schmitt trigger-based fin field effect transistor static random access memory cell comprising
   a first control FinFET (Fin Field Effect Transistor) having a first gate and a second gate;
   a second control FinFET having a third gate and a fourth gate;
   a first bit line connected with a drain of said first control FinFET and supplying a first voltage signal;
   a second bit line connected with a drain of said second control FinFET and supplying a second voltage signal;
   a first read/write control line connected with said first gate and said third gate and controlling conduction states of said first control FinFET and said second control FinFET;
   a second read/write control line connected with said second gate and said fourth gate and controlling conduction states of said first control FinFET and said second control FinFET; and
   a memory cell connected with sources of said first control FinFET and said second control FinFET and performing a data-read activity, a data-write activity or a data-keep activity according to said conduction states of said first control FinFET and said second control FinFET, said first voltage signal and said second voltage signal, wherein said memory cell further comprises a first inverter and a second inverter cross coupled to said first inverter, and wherein said first inverter includes a first FinFET, a second FinFET and a third FinFET, and wherein said second inverter includes a fourth FinFET, a fifth FinFET and a sixth FinFET, and wherein said first inverter has a first storage node connected with gates of said fourth FinFET, said fifth FinFET and said sixth FinFET and said source of said first control FinFET, and wherein said second inverter has a second storage node connected with gates of said first FinFET, said second FinFET and said third FinFET and said source of said second control FinFET, and wherein said third FinFET and said sixth FinFET are grounded, and wherein said first FinFET and said fourth FinFET are connected with a power source.

2. The Schmitt trigger-based fin field effect transistor static random access memory cell according to claim 1, wherein said second FinFET has a fifth gate and sixth gate, and wherein said fifth FinFET has a seventh gate and an eighth gate.

3. The Schmitt trigger-based fin field effect transistor static random access memory cell according to claim 2, wherein said sixth gate of said second FinFET and said eighth gate of said fifth FinFET are respectively connected with said sources of said first control FinFET and said second control FinFET, and wherein said fifth gate of said second FinFET is connected with said gates of said first FinFET and said third FinFET, and wherein said seventh gate of said fifth FinFET is connected with said gates of said fourth FinFET and said sixth FinFET.

4. The Schmitt trigger-based fin field effect transistor static random access memory cell according to claim 2, wherein said sixth gate of said second FinFET and said eighth gate of said fifth FinFET are connected with said second read/write control line, and wherein said fifth gate of said second FinFET is connected with said gates of said first FinFET and said third FinFET, and wherein said seventh gate of said fifth FinFET is connected with said gates of said fourth FinFET and said sixth FinFET.

5. The Schmitt trigger-based fin field effect transistor static random access memory cell according to claim 2, wherein said sixth gate of said second FinFET and said eighth gate of said fifth FinFET are connected with said power source, and wherein said fifth gate of said second FinFET is connected with said gates of said first FinFET and said third FinFET, and wherein said seventh gate of said fifth FinFET is connected with said gates of said fourth FinFET and said sixth FinFET.

6. The Schmitt trigger-based fin field effect transistor static random access memory cell according to claim 1, wherein said memory cell performs a write activity when said first bit line and said second bit line have anti-phase voltage signals and when said first read/write control line or said second read/write control line turns on said first control FinFET and said second control FinFET.

7. The Schmitt trigger-based fin field effect transistor static random access memory cell according to claim 1, wherein said memory cell performs a read activity when said first voltage signal of said first bit line and said second voltage of said second bit line are pre-charged to a high potential and when said first read/write control line or said second read/write control line turns on said first control FinFET and said second control FinFET.

8. The Schmitt trigger-based fin field effect transistor static random access memory cell according to claim 1, wherein said memory cell performs a data-keep activity when said first read/write control line and said second read/write control line are simultaneously turned off.

* * * * *